United States Patent [19]
Gspann

[11] Patent Number: 5,432,341
[45] Date of Patent: Jul. 11, 1995

[54] PROCESS AND APPARATUS FOR PRODUCING AGGLOMERATE RAYS

[76] Inventor: Jürgen Gspann, Krokusweg 19, W-7513 Stutensee, Germany

[21] Appl. No.: 99,358

[22] Filed: Jul. 29, 1993

[30] Foreign Application Priority Data

Jul. 29, 1992 [DE] Germany .................. 42 25 169.9

[51] Int. Cl.⁶ ............................................. H05H 3/00
[52] U.S. Cl. ................................. 250/251; 392/389
[58] Field of Search ............... 250/251, 423–425; 392/386–389; 118/726

[56] References Cited

U.S. PATENT DOCUMENTS

| | | | |
|---|---|---|---|
| 4,217,855 | 8/1980 | Takagi | 118/726 |
| 4,812,326 | 3/1989 | Tsukazaki et al. | 427/562 |
| 4,833,319 | 5/1989 | Knauer | 250/251 |
| 4,856,457 | 8/1989 | Knauer | 118/726 |
| 5,099,791 | 3/1992 | Tsukazaki et al. | 118/726 |

FOREIGN PATENT DOCUMENTS 1164034 10/1958 France .................. 392/389

*Primary Examiner*—Jack I. Berman
*Assistant Examiner*—James Beyer
*Attorney, Agent, or Firm*—Pollock, Vande Sande & Priddy

[57] ABSTRACT

During the production of intensive cluster rays of high boiling point substances for depositing thin layers by the expansion of vapor of the substance to be clustered through a nozzle, a nozzle admission pressure of at least 200 hectopascals is set when the nozzle has a throat width in the range of 0.2 to 1 mm and a divergent outlet portion with an opening angle between about 3° and 30°. Thermal radiation losses from the throat region of the nozzle, which can lead to the undesired emission of larger droplets, are minimized by a heated cover connected to the outlet portion of the nozzle.

**10

PROCESS AND APPARATUS FOR PRODUCING AGGLOMERATE RAYS

FIELD OF THE INVENTION

The invention relates to a process and a device for producing intensive rays of clusters from a few hundred to several thousand atoms of materials exhibiting a high boiling point.

BACKGROUND OF THE INVENTION

For a long time, the aim in technology has been to use the rays of atom clusters, in particular with ionized and electrically accelerated clusters for thin layer deposition (T. Tackagi, I. Yamada, M. Kunoi, S. Kobiyama, Proceedings of the Second International Conference on Ion Sources, Vienna 1972, pages 790–796; DP-AS 25 47 552).

Compared to rays from single atoms, cluster beams deliver higher mass flow densities, in particular also of accelerated ionized clusters, and produce an especially intimate connection to the substrate even at a low substrate temperature when the kinetic energy of bombardment is appropriate.

A vapor-coating system is known from DP-AS 245 47 522, where the material to be deposited is heated and evaporated in a crucible, which is closed except for a nozzle opening, in a high vacuum, in order to cool on the basis of adiabatic expansion when ejected from the nozzle and to condense into atom clusters. It can be inferred from DP-PS 26 28 366, line 35, or DP-PS 3502902, line 45, that a nozzle admission pressure of about $10^{-2}$ hectopascals up to a few hectopascals is used in the crucible.

However, more recent studies of beams produced with corresponding, also commercially available systems, have clearly shown that these beams contain virtually no detectable portion of clusters with more than about 25 atoms. (W. L. Brown, M. F. Jarrold, R. L. NcEachern, N. Sosnowski, G. Takaoka, H. Usui, I. Yamada, Nuclear Instruments and Methods in Physics Research, volume B59/60, 1991, pages 182–189; D. Turner, H. Shanks, Journal of Applied Physics, volume 70, 1991, pages 5385 to 5400). Therefore, the effects of ionization and acceleration of such rays on the deposited layer should stem only from ionized single atoms. It is also in keeping with the fact that the targeted coating rates are only in the range of 0.1 nm layer thickness per second and thus also correspond to the coating rates that can be obtained with conventional molecular ray epitaxy.

SUMMARY OF THE INVENTION

By contrast, the invention is directed to the problem of providing a process and an apparatus for producing intensive rays of clusters, with which the possible coating rates can be raised by orders of magnitude and the expected good effects of the cluster impingement on the substrate surface can be obtained.

The solution to this problem consists, according to the invention, in equipping the crucible for evaporating the material with one or more nozzles whose length ranges from a few to tens of mm and whose opening angle ranges from about 3° to about 30°, and in adjusting the nozzle admission pressure in the crucible to at least about 200 hectopascals when the narrowest widths of the nozzle range from 0.2 to 1.0 min.

In so doing, the narrower the throat of the nozzle and the larger its opening angle, the higher a nozzle admission pressure must be selected. For high boiling point materials, the product of the nozzle admission pressure, narrowest nozzle width and reciprocal opening angle should amount to at least about 20 hectopascals×mm/degree.

To adjust these values, crucible temperatures distinctly higher than those conventional in the art are routinely necessary. Therefore, the losses due to the radiation of heat that increase with the fourth power of the temperature also significantly increase especially in the nozzle region. On the other hand, it is difficult to balance the temperature over the material of the crucible due to the relatively poor thermal conductivity of the few crucible materials that melt at an adequately high temperature. As a result, the temperature drops significantly from the crucible side walls to the region of the nozzle throat.

Such a temperature gradient can result in premature partial condensation of the vapor on the inner wall of the nozzle before reaching the narrowest cross section of the nozzle. If the molten material does not wet the nozzle material, i.e., does not spread to cover the nozzle material as a continuous layer, the vapor precipitating on the inner wall of the nozzle forms small droplets. This is the case with many molten metals in combination with graphite as the nozzle material. Droplets with radii up to the millimeter range are dragged out of the nozzle by the vapor at higher vapor densities (3. Gespann, Nuclear Instruments and Methods, volume B37/38, 1989, pages 775 to 778). The precipitation of such droplets on the substrate destroys the homogeneity of the layer that forms and renders its useless.

Therefore, in a preferred embodiment of the process according to the invention, a nozzle material is chosen that is wetted (as defined in the preceding paragraph) by the molten material. For example, significantly less droplet formation is observed with a tantalum nozzle for the expansion of zinc vapor than with nozzles made of graphite.

In another preferred embodiment of the process according to the invention, the nozzle region is constantly maintained at a temperature above the temperature of the surface of the material to be vaporized. Since the crucible bottom also represents a heat sink, this can be accomplished, e.g. by means of a suitable fill height of the crucible.

In the apparatus according to the invention, the outlet member of the nozzle is connected by means of a perforated cover (11) directly to the heating element (11), which envelops the crucible and may or may not comprise different parts that can be controlled separately. This arrangement solves the problem of producing intensive rays of clusters. In addition, the upper edge of the heating element must be at the same electric potential as the nozzle. Thus, the device can be designed in such a manner that the heating element itself is connected to the outlet member of the nozzle (FIG. 4).

In another embodiment of the apparatus of the invention, the outlet member of the nozzle is connected to a perforated cap enveloping the heating element, optionally over its entire length. This embodiment is chosen, when the electric potential of the upper edge of the heater is not uniformly identical to that of the nozzle. In addition to its function as a radiation shield for the region of the nozzle throat, the cap also shields in this case the cluster beam issuing from the nozzle mouth, against the electrons emitted thermally from the heater. Owing to the potential difference relative to the nozzle, such electrons can obtain enough energy to ionize free atoms or clusters. The plasma that forms seems to be removable for producing an intensive cluster beam.

Finally, in another embodiment of the apparatus according to the invention, the heating can also be accomplished by means of a direct current flow via the cap to the nozzle and through the crucible.

The cross section of the nozzle or nozzles may be non-circular. In this case, the narrowest width of the cross-section should be used as the effective throat width. (Zinc cluster beams have already been produced with a nozzle having a square cross-section.) Non-circular nozzle cross sections can offer advantages during nozzle production, in particular for nozzles with very small opening angles.

In a preferred embodiment, the apparatus according to the invention provides for a relatively large distance (about three times the length of the divergent outlet portion of the nozzle) between the nozzle mouth and the downstream ray diaphragm, in order to provide sufficient space for expansion of the vapor flowing through the nozzle. The opening of the ray diaphragm can be as wide as the ray cone, which is defined geometrically by the opening angle of the nozzle, permits at the location of the diaphragm. The diaphragm may also be heated separately in order to prevent or eliminate excessive coverage of the diaphragm.

BRIEF DESCRIPTION OF THE DRAWINGS

Several embodiments of the process and apparatus according to the invention will now be explained in detail by way of example and with the aid of the attached drawings, in which.

DESCRIPTION OF PREFERRED EMBODIMENT

Figure 1:
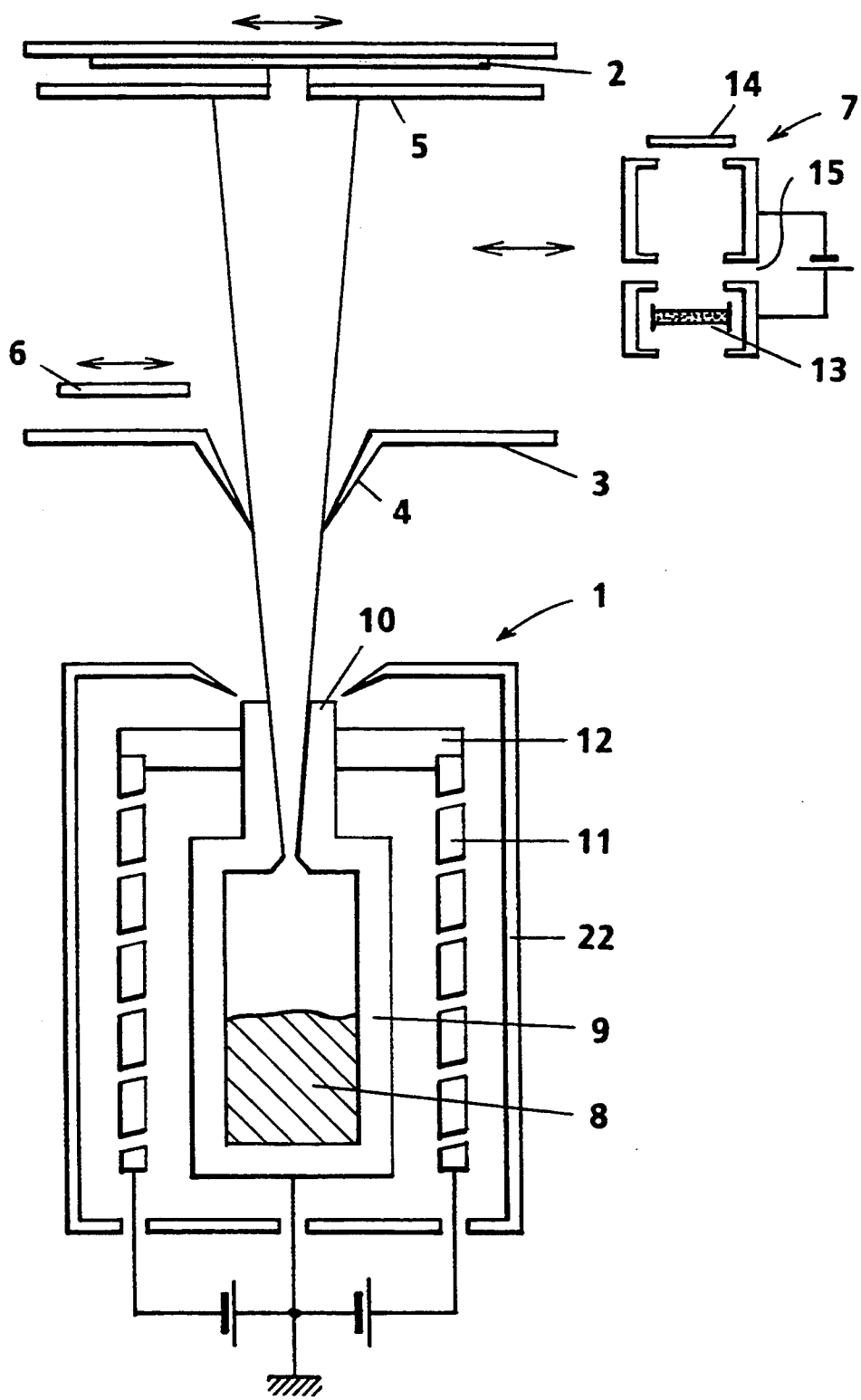
FIG. 1 is a schematic view of the production of the a cluster beam in a coating installation, showing the nozzle connected to the heating element by way of a perforated cover.

The system, shown in FIG. 1, for producing intensive cluster beams for thin layer deposition is located in a high vacuum chamber and comprises an apparatus 1 for producing the cluster beams, a substrate 2 located on a moveable substrate holder, and a cooled collecting surface 3 with a conical ray diaphragm 4. Upstream of the substrate, another ray diaphragm 5 and a beam shutter 6 can be brought into the beam. The substrate holder and the diaphragm 5 may be replaced by a time-of-flight mass spectrometer 7, enables which the size and velocity of the beam clusters to be determined. A prior art device for ionizing and accelerating the clusters can be used, but is not shown in FIG. 1.

The material 8 to be vaporized is introduced into the crucible 9, which is made of graphite in the present case and which is closed by a screwed on nozzle 10 made of graphite or high melting metal, e.g. tantalum. The heater 11 is made in the case described of a double helix graphite coil, through which the heating current flows. The electric potential of the upper edge of the coil can be calibrated to that of the crucible, which in this case is equal to the ground potential. A perforated cover 12, also made of graphite, is placed on the heater and thermally and electrically produces a connection to the outlet portion of the nozzle 10, which, however, remains without current due to the equivalence of the electric potential.

The heater 11 with cover 12 is surrounded by a multi-layered arrangement of high melting radiation shields and a water-cooled shell. In FIG. 1, this arrangement is drastically simplified as a radiation shield 22. The upper part of this shield has a conical opening angle of about 80° to 150°. A distance of about 90 mm, but at least about 20 mm, is provided between the mouth of the nozzle 10 and the inlet opening of the conical diaphragm 4. The bulk of the vapor expanding through the nozzle 10 precipitates on the cooled surfaces 3 and 4.

The opening of the ray diaphragm 4 is so selected that it can pass the ray cone, defined geometrically by the opening angle of the nozzle 10.

Figure 2:
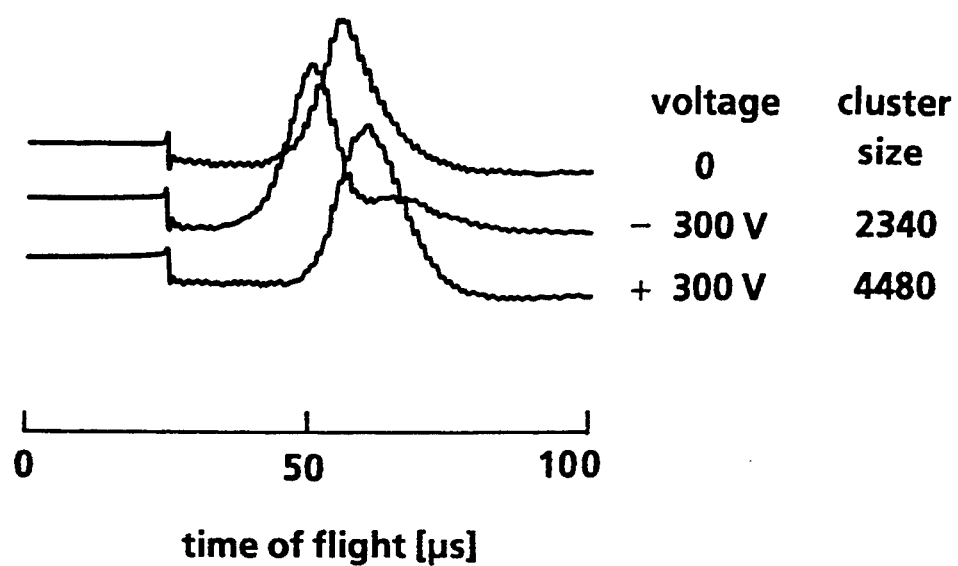
FIG. 2 is a graph showing the flight time signals of zinc cluster beams.

FIG. 2 shows the flight time signals of the zinc cluster beams, recorded by the time-of-flight mass spectrometer 7. Electron impact ionization of the clusters for about 2 μs resulted in cluster pulses diverging in time on the segment between electron layer 13 and collector 14 on account of the different cluster speeds. Without electric acceleration at the acceleration segment 15 the result was the upper flight time signal, from which an average cluster speed of about 1 km/s can be calculated, whereas a negative acceleration voltage allowed the clusters to arrive earlier (middle signal), and a positive acceleration voltage allowed the clusters to arrive later (bottom signal) at the collector. The average cluster sizes calculated from the signal shifts rise from the middle to the bottom curve from 2340 to 4480 atoms per elementary charge, because the crucible temperature, and thus the nozzle admission pressure, increased during the measurements.

Figure 3:
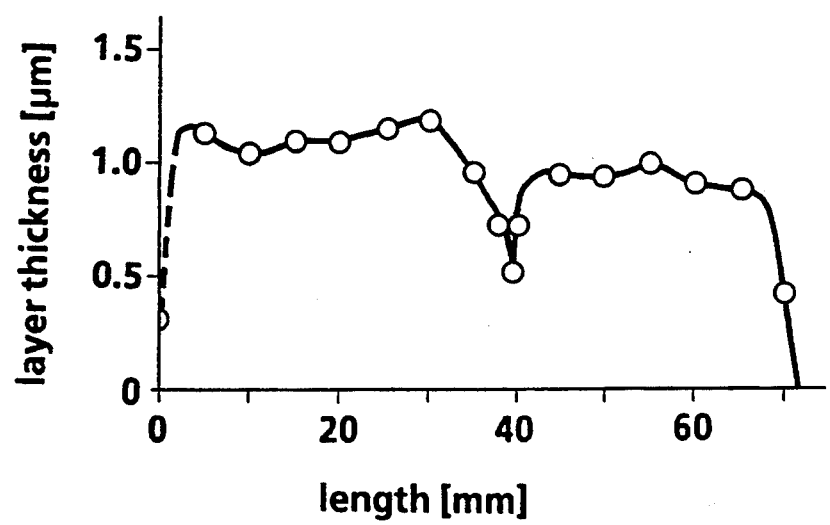
FIG. 3 is a graph showing the thickness of the deposited zinc layer on a substrate moved behind a slit diaphragm.

FIG. 3 shows the measured layer thickness of the zinc layer, deposited on a silicon wafer moved past behind the slit diaphragm 5 at a distance of 300 mm from the nozzle mouth. The speed at which the wafer is moved was so selected that the layer was deposited in 10 seconds. FIG. 3 thus indicates an average coating rate of about 0.1 μm/s, which is 3 orders of magnitude above the normal rates for prior art systems.

Figure 4:
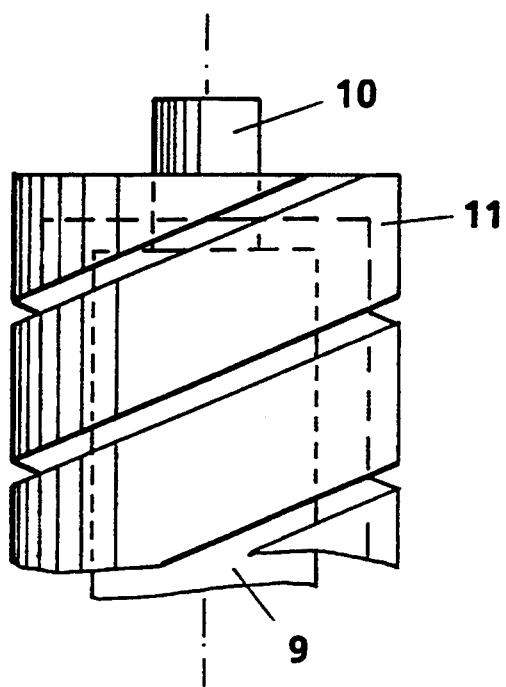
FIG. 4 shows the embodiment in which the heating element is moved to the nozzle.

FIG. 4 shows an embodiment of the apparatus according to the invention in which the heating element is connected directly to the outlet portion of the nozzle 10 and the slots of the heating coil do not terminate until they reach the cover portion of the heating element 11. Thus, the current also flows through and heats this cover portion. In the illustrated preferred embodiment, the slots in the cover portion, are inclined, relative to the crucible axis, such that no radiation can escape from the nozzle throat parallel to the crucible axis.

Figure 5:
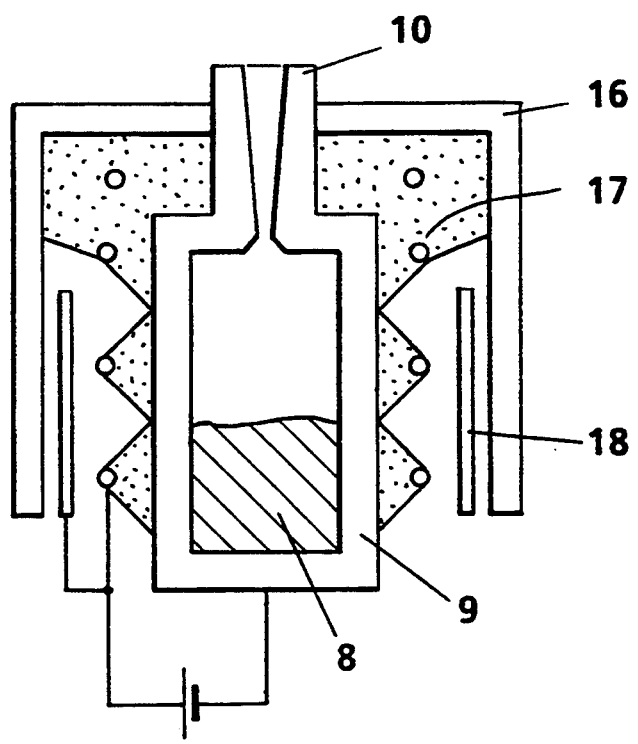
FIG. 5 shows the apparatus according to the invention with a cap surrounding the heating element.

FIG. 5 shows an embodiment of the apparatus according to the invention in which the electric potential at the upper edge of the heating element is not uniformly equal to that of the crucible. In this case, the heater is surrounded by a perforated cap 16, which rests on the outlet portion of the nozzle 10 and which may extend over the entire axial length of the heating element. This embodiment of the apparatus is used, e.g., even when the crucible is heated preferably by electron impact and large electric voltages are therefore applied between the heating coil(s), serving in this case as electron emitter(s), and the crucible. A reflector jacket 18 at the potential of the electron emitter(s) 17 can be used to diminish the heating of the lower portion of the cap.

Figure 6:
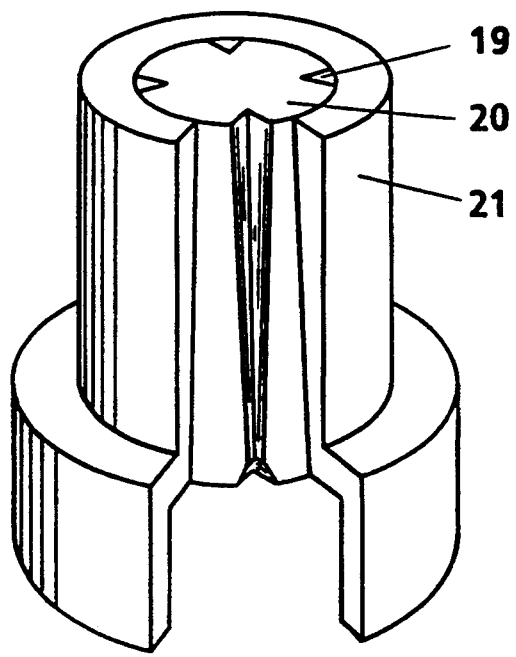
FIG. 6 shows an arrangement of four nozzles with triangular cross section mutually converging axes.

For multi-nozzle arrangements, the average ray directions can be inclined relative to each other, e.g., they diverge like a fan or intersect at a focal point for the purpose of increasing the intensity. With such nozzle arrangements, it is possible to obtain different angles of impact of the clusters on the substrates, resulting in possible advantages when coating the edges of the structure. FIG. 6 shows one example of an implemented arrangement of four nozzles with triangular cross section, whose flow directions converge. The nozzles are incorporated as notches 19, which become deeper starting from the nozzle throat, into a slightly conical core member 20, onto which a smooth clamping cone 21 is pressed.

What is claimed is:

1. A process for producing a ray of clusters of atoms, through expansion of the vapor of a material to be clustered from a heated crucible through at least one nozzle, wherein said at least one nozzle comprises a divergent outlet portion having a length in a range of up to tens of millimeters, having an opening angle in a range of about 3° to 30°, and a minimum width in a range of about 0.2 to about 1.0 mm, said at least one nozzle having a prechamber with a vapor pressure set to at least about 200 hectopascals.

2. A process according to claim 1, wherein the product of said nozzle prechamber vapor pressure, said minimum nozzle width, and said reciprocal opening angle is adjusted to at least 20 hectopascals×mm/degree.

3. A process according to claim 1, wherein at least one of said at least one nozzle has a non-circular cross section.

4. A process according to claim 1, wherein the axes of at least two nozzles of said at least one nozzle are inclined relative to each other so as to intersect at a focal point.

5. An apparatus for producing a ray of clusters of atoms through expansion of the vapor of a material to be clustered from a heated crucible through at least one nozzle having a divergent outlet portion having a length in a range of up to tens of millimeters, having an opening angle in a range of about 3° to 30°, and a minimum width in a range of about 0.2 to about 1.0 mm, said at least one nozzle having a prechamber with a vapor pressure set to at least about 200 hectopascals.

6. An apparatus according to claim 5, further including a heating element surrounding at least a portion of said crucible, having an upper edge which is at a same electric potential as said crucible and having an upper portion connected to said outlet portion of said at least one nozzle member.

7. An apparatus according to claim 5, wherein said outlet portion is connected to a perforated cap which surrounds a heating element.

8. An apparatus according to claim 7, wherein heating occurs by means of direct current flow directly via said cap to the nozzle and through said crucible.

9. An apparatus according to claim 5, wherein vapor flowing through said at least one nozzle is collected by a cooled surface (3).

10. An apparatus according to claim 5, wherein the distance between the mouth of said at least one nozzle and an inlet opening of a ray diaphragm (4) equals at least the length of said outlet portion of said at least one nozzle (10).

* * * * *